US012598794B2

(12) United States Patent
Yuan et al.

(10) Patent No.: US 12,598,794 B2
(45) Date of Patent: Apr. 7, 2026

(54) SEMICONDUCTOR MATERIAL, LIGHT-EMITTING DEVICE, DISPLAY PANEL AND DISPLAY DEVICE

(71) Applicant: BOE TECHNOLOGY GROUP CO., LTD., Beijing (CN)

(72) Inventors: Guangcai Yuan, Beijing (CN); Hehe Hu, Beijing (CN); Fengjuan Liu, Beijing (CN); Ce Ning, Beijing (CN); Zhengliang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 504 days.

(21) Appl. No.: 18/016,899

(22) PCT Filed: Feb. 17, 2022

(86) PCT No.: PCT/CN2022/076567
§ 371 (c)(1),
(2) Date: Jan. 19, 2023

(87) PCT Pub. No.: WO2023/155085
PCT Pub. Date: Aug. 24, 2023

(65) Prior Publication Data
US 2024/0128327 A1 Apr. 18, 2024

(51) Int. Cl.
H10D 62/80 (2025.01)
H10D 30/67 (2025.01)

(52) U.S. Cl.
CPC ......... H10D 62/80 (2025.01); H10D 30/6755 (2025.01)

(58) Field of Classification Search
CPC ..... H10D 62/80; H10D 30/6755; H01L 21/34
USPC .......................................................... 257/43
See application file for complete search history.

(56) References Cited

U.S. PATENT DOCUMENTS

| | | | |
|---|---|---|---|
| 5,847,437 A | 12/1998 | Chang et al. | |
| 2013/0009111 A1 | 1/2013 | Morita et al. | |
| 2013/0264565 A1* | 10/2013 | Nishimura | H10D 99/00 257/43 |
| 2015/0155505 A1 | 6/2015 | Yamazaki et al. | |
| 2016/0284857 A1* | 9/2016 | Yamazaki | H10D 30/6755 |

(Continued)

FOREIGN PATENT DOCUMENTS

| | | |
|---|---|---|
| CN | 102792451 A | 11/2012 |
| CN | 103155154 A | 6/2013 |

(Continued)

*Primary Examiner* — Monica D Harrison
(74) *Attorney, Agent, or Firm* — WHDA, LLP

(57) ABSTRACT

The present disclosure has disclosed a semiconductor material, light-emitting device, display panel and display device. The semiconductor material comprises: at least two of an oxide of a first element, an oxide of a second element, an oxide of a third element, an oxide of a fourth element and a compound of fifth element, and comprises at least the oxide of the first element and the compound of the fifth element; the first element comprises at least one of In, Zn, Sn, Cd, Tl and Pb; the second element comprises at least one of Ta, Ga, W, Ba, V, Hf and Nb; the third element comprises at least one of Sn, Zr, Cr and Si; the fourth element comprises at least one of Zn, Al, Sn, Ta, Hf, Zr and Ti; and the compound of the fifth element comprises $M_xA$.

18 Claims, 3 Drawing Sheets

(56)          References Cited

U.S. PATENT DOCUMENTS

2019/0378933 A1*  12/2019  Inoue ................ H01L 21/02565
2020/0098933 A1    3/2020  Tanaka
2021/0028010 A1*   1/2021  Kim ...................... H10D 1/716
2021/0083124 A1    3/2021  Xu et al.
2021/0210518 A1    7/2021  Tanaka et al.
2022/0059661 A1    2/2022  Xu et al.

FOREIGN PATENT DOCUMENTS

CN        103779427  B      6/2016
CN        107484435  A     12/2017
CN        108987467  A     12/2018
CN        109638070  A      4/2019
CN        110676395  A      1/2020
CN        110797395  A      2/2020
CN        110957372  A      4/2020
CN        112309831  A      2/2021
CN        113078185  A      7/2021

* cited by examiner

SEMICONDUCTOR MATERIAL, LIGHT-EMITTING DEVICE, DISPLAY PANEL AND DISPLAY DEVICE

CROSS-REFERENCE TO RELATED APPLICATIONS

This application is the U.S. national phase of PCT Application No. PCT/CN2022/076567, filed on Feb. 17, 2022, the disclosure of which is incorporated in its entirety by reference herein.

TECHNICAL FIELD

The present disclosure relates to the field of display technology, and specifically relates to a semiconductor material, a light-emitting device, a display panel and a display device.

BACKGROUND

The Thin Film Transistor (TFT) is a core element of a display device, and each pixel of the display device depends on thin-film transistor for switching and driving. According to the different semiconductor material of an active layer of a thin-film transistor, the thin-film transistor mainly comprises an oxide thin-film transistor and an amorphous silicon thin-film transistor. The oxide thin-film transistor has high mobility, may improve the resolution of display devices, and is widely used in display devices.

The active layer of an oxide thin-film transistor connects source and drain of the oxide thin-film transistor respectively. When the oxide thin-film transistor works, carriers are generated in the active layer, and the source and the drain connected by the active layer are turned on, such that this oxide thin-film transistor starts to work. The active layer of an oxide thin-film transistor is made of a semiconductor material. The mobility of the semiconductor material currently used is low and susceptible to the influence of light, which affects the stability of oxide thin-film transistors.

SUMMARY

Embodiments of the present disclosure provide a semiconductor material, a light-emitting device, a display panel and a display device.

In the first aspect, embodiments of the present disclosure provide a semiconductor material, comprising: at least two selected from a group consisting of an oxide of a first element, an oxide of a second element, an oxide of a third element, an oxide of a fourth element and a compound of a fifth element, and comprising at least the oxide of the first element and the compound of the fifth element;
the first element comprises at least one selected from a group consisting of In, Zn, Sn, Cd, Tl and Pb;
the second element comprises at least one selected from a group consisting of Ta, Ga, W, Ba, V, Hf and Nb;
the third element comprises at least one selected from a group consisting of Sn, Zr, Cr and Si;
the fourth element comprises at least one selected from a group consisting of Zn, Al, Sn, Ta, Hf, Zr and Ti; and
the compound of the fifth element comprises $M_xA$, wherein M comprises at least one selected from a group consisting of Ce, Pr, Nd, Pm, Sm, Tb and Dy; A comprises at least one selected from a group consisting of O, N, S, Se, Te, Br, I, As and B; and x is greater than zero.
Optionally, the mass ratio of the oxide of the first element, the oxide of the second element, the oxide of the third element, the oxide of the fourth element and the compound of the fifth element is (55% to 90%):(0% to 10%):(0% to 10%):(0% to 10%):(0.0001% to 15%).

Optionally, the first element comprises at least one selected from a group consisting of In, Zn and Sn; and/or the second element comprises at least one selected from a group consisting of Ta, Ga and W; and/or the third element comprises Sn; and/or the fourth element comprises at least one selected from a group consisting of Zn, Al and Ta; and/or M comprises at least one selected from a group consisting of Pr, Sm and Tb, and A comprises at least one selected from a group consisting of O, N and B.

Optionally, the semiconductor material comprises: the oxide of the first element, the oxide of the second element, the oxide of the third element and the compound of the fifth element, in which the first element is In, the second element is Ta, the third element is Sn and the compound of the fifth element is an oxide of Pr; or
the semiconductor material comprises: the oxide of the first element, the oxide of the second element, the oxide of the fourth element and the compound of the fifth element, in which the first element is In, the second element is Ta, the fourth element is Zn and the compound of the fifth element is an oxide of Pr; or
the semiconductor material comprises: the oxide of the first element, the oxide of the second element, the oxide of the third element, the oxide of the fourth element and the compound of the fifth element, in which the first element is In, the second element is Ta, the third element is Sn, the fourth element is Al and the compound of the fifth element is a boride of Tb; or
the semiconductor material comprises: the oxide of the first element, the oxide of the second element, the oxide of the fourth element and the compound of the fifth element, in which the first element is In and Zn, the second element is Ta, the fourth element is Al and the compound of the fifth element is a boride of Tb; or
the semiconductor material comprises: the oxide of the first element, the oxide of the second element, the oxide of the third element and the compound of the fifth element, in which the first element is In, the second element is W, the third element is Sn and the compound of the fifth element is a boride of Tb; or
the semiconductor material comprises: the oxide of the first element, the oxide of the second element, the oxide of the third element and the compound of the fifth element, in which the first element is In, the second element is Ta, the fourth element is Zn and the compound of the fifth element is an oxide of Tb; or
the semiconductor material comprises: the oxide of the first element, the oxide of the second element, the oxide of the third element, the oxide of the fourth element and the compound of fifth element, in which the first element is In, the second element is Ta, the third element is Sn, the fourth element is Zn and the compound of the fifth element is an oxide of Pr; or
the semiconductor material comprises: the oxide of the first element, the oxide of the second element, the oxide of the third element, the oxide of the fourth element and the compound of the fifth element, in which the first element is In, the second element is Ta, the third element is Sn, the fourth element is Zn and the compound of the fifth element is a boride of Tb.

In the second aspect, embodiments of the present disclosure provide a light-emitting device, comprises a semiconductor thin film which comprises the semiconductor material described in the above embodiments.

Optionally, the carrier concentration of the semiconductor thin film is less than or equal to $5 \times 10^{19}$ cm$^{-3}$.

Optionally, the mobility of the semiconductor thin film is in a range of 30 $cm^2/Vs$ to 200 $cm^2/Vs$.

Optionally, the thickness of the semiconductor thin film is in a range of 20 nm to 100 nm.

Optionally, the semiconductor thin film has microcrystalline structure.

Optionally, the light-emitting device further comprises: a substrate on which a gate layer locates; and a gate insulating layer which covers the gate layer, and the semiconductor thin film is provided on the gate insulating layer and has a source and a drain.

In the third aspect, embodiments of the present disclosure provide a display panel which comprises the light-emitting device described in the above embodiments.

In the fourth aspect, embodiments of the present disclosure provide a display device which comprises the display panel described in the above embodiments.

DRAWING REFERENCES

Figure 1:
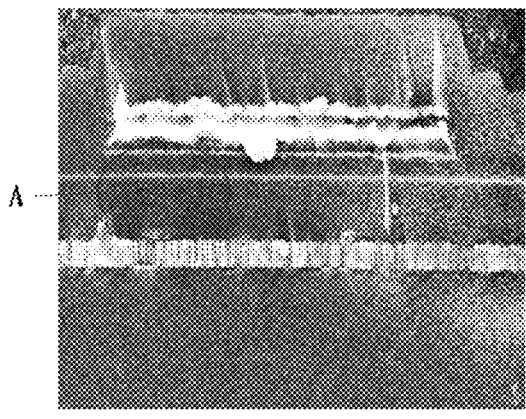
FIG. 1 is an scanning electron microscopy (SEM) showing a microcrystalline structure formed in the oxide of Al.

Substrate 10;
Gate layer 11;
Gate insulating layer 20;
Semiconductor thin film 30;
Source 31;
Drain 32.

DETAILED DESCRIPTION

The semiconductor material provided by embodiments of the present disclosure will be described in detail below with reference to FIG. 1 to FIG. 7 through specific embodiments.

The semiconductor material of embodiment of the present disclosure comprises: at least two selected from a group consisting of an oxide of a first element, an oxide of a second element, an oxide of a third element, an oxide of a fourth element and a compound of a fifth element, and comprises at least the oxide of the first element and the compound of the fifth element. For example, the semiconductor material comprises: the oxide of the first element, the oxide of the second element, the oxide of the third element and the compound of the fifth element, or the semiconductor material comprises: the oxide of the first element, the oxide of the second element, the oxide of the third element, the oxide of the fourth element and the compound of the fifth element. The first element, the second element, the third element, the fourth element and the fifth element may include at least four elements in total, such as five elements. The first element, the second element, the third element, the fourth element and the fifth element have one element respectively, and the element in the first element, the second element, the third element, the fourth element and the fifth element are different. The first element may comprise at least one of In (indium), Zn (zinc), Sn (tin), Cd (cadmium), Tl (thallium) and Pb (lead). For example, the first element may comprise In and Zn, and the oxide of the first element may comprise IZO (indium zinc oxide), which may improve the mobility of the material. The first element may be a metallic element with a large-radius ns orbital in outermost electron shell of the cation, which has high mobility.

The second element may include at least one of Ta (tantalum), Ga (gallium), W (tungsten), Ba (barium), V (vanadium), Hf (hafnium) and Nb (niobium). For example, the second element may comprise Ta or Nb, and the oxide of the second element may include tantalum pentoxide (Ta$_2$O$_5$). Ga and W are not subject to air erosion at room temperature, and Ta (tantalum) has atomic number of 73, which has very high corrosion resistance. The second element has a better anti-H (hydrogen) oxygen fixation effect. The third element may include at least one of Sn (tin), Zr (zirconium), Cr (chromium) and Si (silicon). For example, the third element may include Sn or Cr, the oxide of the third element may include SnO$_2$, and the oxide of the third element may include one or more of Cr$_2$O$_3$, CrO$_3$ and CrO$_2$. The third element may be Sn, and the acid corrosion resistance may be improved by such third element. The fourth element may include at least one of Zn (zinc), Al (aluminum), Sn (tin), Ta (tantalum), Hf (hafnium), Zr (zirconium) and Ti (titanium). For example, the fourth element may include Zn or Al, or the fourth element may include Zn and Sn. The ability to form microcrystals may be improved by the fourth element, which is beneficial to improved stability. The compound of the fifth element may include M$_x$A, where M includes at least one of Ce (cerium), Pr (praseodymium), Nd (neodymium), Pm (promethium), Sm (samarium), Tb (terbium) and Dy (dysprosium); and A includes at least one of O (oxygen), N (nitrogen), S (sulfur), Se (selenium), Te (tellurium), Br (bromine), I (iodine), As (arsenic) and B (boron), x is greater than zero. For example, M$_x$A may be CeO$_2$ or CeS, and M$_x$A may include at least one of PrBr$_3$, Pr$_2$Br$_5$, PrI$_2$, PrI$_3$, Pr$_2$I$_5$, PrO$_2$, Pr$_2$O$_3$, PrSe, PrTe, Pr$_2$Te$_3$ and PrN. The minimum energy required for the f-d transition of the M element may be greater than 2.48 eV and less than 2.64 eV. The semiconductor material may be amorphous, and the semiconductor material may have microcrystalline structure.

By adding the above compounds in the semiconductor material, may result in high mobility of the semiconductor material in the present disclosure and have better stability, and the active layer of oxide thin-film transistors may be prepared using the semiconductor material in the present disclosure, which may improve mobility of TFT and improve stability. Semiconductor materials may be used to prepare targets, flexible or glass-based thin-film transistor devices and displays, such as that may be applied to flexible or glass-based thin-film transistors and displays prepare by laminated channels containing semiconductor materials, which can improve the display effect.

In some embodiments, the mass ratio of the oxide of the first element, the oxide of the second element, the oxide of the third element, the oxide of the fourth element and the compound of the fifth element may be (55% to 90%):(0% to 10%):(0% to 10%):(0% to 10%):(0.0001% to 15%). Optionally, the mass ratio of the oxide of the first element, the oxide of the second element, the oxide of the third element, the oxide of the fourth element and the compound of the fifth element may be (55% to 90%):(0.0001% to 5%):(5% to 10%):(3% to 5%):(1% to 10%). For example, the mass ratio of the oxide of the first element, the oxide of the second element, the oxide of the third element, the oxide of the fourth element and the compound of the fifth element may be 70%:5%:10%:5%:10%, and the specific mass ratio may be adjusted reasonably according to the actual situation.

In embodiments of the present disclosure, the first element may include at least one of In, Zn and Sn. Optionally, the second element may include at least one of Ta, Ga and W. Optionally, the third element may include Sn. Optionally, the fourth element may include at least one of Zn, Al and Ta. M may include at least one of Pr, Sm and Tb, and A may include at least one of O, N and B. For example, the first element may be In, the second element may be Ta, the third element may be Sn, the fourth element may be Zn, M may be Pr, and A may include O or B. It can make the material have higher mobility, anti-H oxygen fixation, resistance to acid corrosion, better overall stability and less susceptible to light.

In some embodiments, the semiconductor material may include: the oxide of the first element, the oxide of the second element, the oxide of the third element and the compound of the fifth element. The first element is In, the second element is Ta, the third element is Sn and the compound of the fifth element is oxide of Pr.

Optionally, the semiconductor material may comprise: the oxide of the first element, the oxide of the second element, the oxide of the fourth element and the compound of the fifth element. The first element is In, the second element is Ta, the fourth element is Zn and the compound of the fifth element is oxide of Pr.

Optionally, the semiconductor material comprises: the oxide of the first element, the oxide of the second element, the oxide of the third element, the oxide of the fourth element and the compound of the fifth element. The first element is In, the second element is Ta, the third element is Sn, the fourth element is Al and the compound of the fifth element is boride of Tb.

Optionally, the semiconductor material comprises: the oxide of the first element, the oxide of the second element, the oxide of the fourth element and the compound of the fifth element. The first element is In and Zn, the second element is Ta, the fourth element is Al and the compound of the fifth element is boride of Tb.

Optionally, the semiconductor material may comprise: the oxide of the first element, the oxide of the second element, the oxide of the third element and the compound of the fifth element. The first element is In, the second element is W, the third element is Sn and the compound of the fifth element is boride of Tb (Terbium boride).

Optionally, the semiconductor material may comprise: the oxide of the first element, the oxide of the second element, the oxide of the third element and the compound of the fifth element. The first element is In, the second element is Ta, the fourth element is Zn and the compound of the fifth element is oxide of Tb.

Optionally, the semiconductor material may comprise: the oxide of the first element, the oxide of the second element, the oxide of the third element, the oxide of the fourth element and the compound of the fifth element. The first element is In, the second element is Ta, the third element is Sn, the fourth element is Zn and the compound of the fifth element is oxide of Pr.

Optionally, the semiconductor material may comprise: the oxide of the first element, the oxide of the second element, the oxide of the third element, the oxide of the fourth element and the compound of fifth element. The first element is In, the second element is Ta, the third element is Sn, the fourth element is Zn and the compound of the fifth element is boride of Tb.

Embodiments of the present disclosure provide a light-emitting device, comprising a semiconductor thin film, which may comprise the semiconductor material described in the above embodiments. The light-emitting device with the semiconductor material in the above embodiments has good luminescence effect and high stability.

In some embodiments, the carrier concentration of the semiconductor thin film may less than or equal to $5 \times 10^{19}$ $cm^{-3}$, and the carrier concentration of the semiconductor thin film may be $4 \times 10^{19}$ $cm^{-3}$. The higher the carrier concentration, the more the material is biased toward the conductor and the threshold voltage $V_{th}$ is more likely to be negatively biased, and the carrier concentration may be less than or equal to $5 \times 10^{19}$ $cm^{-3}$ to ensure the controllable value of $V_{th}$.

Optionally, the mobility of semiconductor thin film is 30 to 200 $cm^2/Vs$, for example, the mobility of semiconductor thin film is 40 $cm^2/Vs$.

Optionally, the thickness of the semiconductor film is in a range of 20 nm to 100 nm, for example, the thickness of the semiconductor thin film may be 30 nm, 40 nm or 50 nm, the specific thickness may be selected according to the actual situation of the light-emitting device.

In some embodiments, the semiconductor thin film has microcrystalline structure, which facilitates improved mobility and stability.

Figure 5:
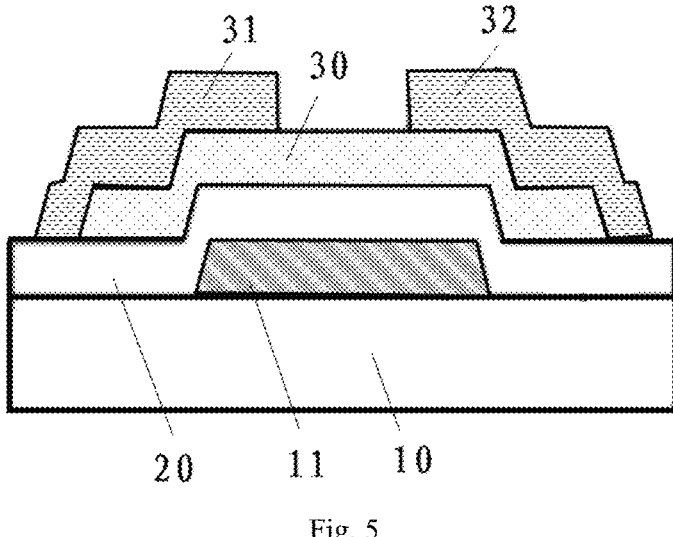
FIG. 5 is a schematic view showing the structure of the light-emitting device according an embodiments of the present disclosure.

In embodiments of the present disclosure, as shown in FIG. 5, the light-emitting device further comprises a substrate 10 and a gate insulating layer 20. The gate layer 11 is provided on the substrate 10, the gate insulating layer 20 covers the gate layer 11, the semiconductor thin film 30 is arranged on the gate insulating layer 20, and a source 31 and a drain 32 is provided on the semiconductor thin film 30. The semiconductor film 30 may be used as an active layer, and the semiconductor thin film 30 may be connected to the source 31 and the drain 32, respectively. When the oxide thin-film transistor works, carriers are generated in the active layer, and the source and the drain connected by the active layer are turned on, such that this oxide thin-film transistor starts to work. The semiconductor thin film 30 as the active layer is not easily affected by light, and photogenerated carriers will not be generated when the active layer is irradiated by light, ensuring the stability of the oxide thin-film transistor and the stability of the light-emitting device.

Embodiment 1

The semiconductor material according to the embodiment of the present disclosure may be prepared into a semiconductor material thin film. The semiconductor material thin film comprises: a small amount of Ta oxide which may be doped in the indium oxide semiconductor thin film by ceramic target magnetron sputtering to improve the ability of anti-H and oxygen fixation; a small amount of Sn oxide which is doped to improve the acid corrosion resistance; and the oxide of Pr which is doped to improve light stability. The semiconductor material $InTaSnPrO_y$ (y is greater than zero) is formed in such way, and the semiconductor material $InTaSnPrO_y$ represents the oxides of four elements In, Ta, Sn and Pr, in which the mass ratio of the In oxide is 86%, the mass ratio of the Ta oxide is 3%, the mass ratio of the Sn oxide is 8%, and the mass ratio of the Pr oxide is 3%.

The thickness of the $InTaSnPrO_y$ semiconductor material thin film is 50 nm, and the carrier concentration is less than $5 \times 10^{19}$ $cm^{-3}$. TFT characteristics can be shown in FIG. 3 and Table 1, the threshold voltage of TFT characteristics is 1.5V and the mobility is 40 $cm^2/Vs$.

TABLE 1

| | | Test data of the TFT characteristics | | | |
|---|---|---|---|---|---|
| $V_{ds}$ (drain voltage, V) | $I_{on}$ (on-state current, A) | $I_{off}$ (off-state current, A) | $I_{on/off}$ (on/off ratio) | SS(Sub-threshold swing, V/Dev.) | $V_{th}$ (V) |
| 0.1 | 9.9E−07 | 3.8E−15 | 2.6E+08 | 0.123 | 0.549 |
| 5.1 | 4.2E−05 | 5.7E−14 | 7.3E+08 | 0.141 | 1.315 |
| 10.1 | 6.4E−05 | 1.1E−13 | 6.0E+08 | 0.161 | 1.426 |
| 15.1 | 7.1E−05 | 7.2E−13 | 9.8E+07 | 0.149 | 1.518 |

Figure 4:
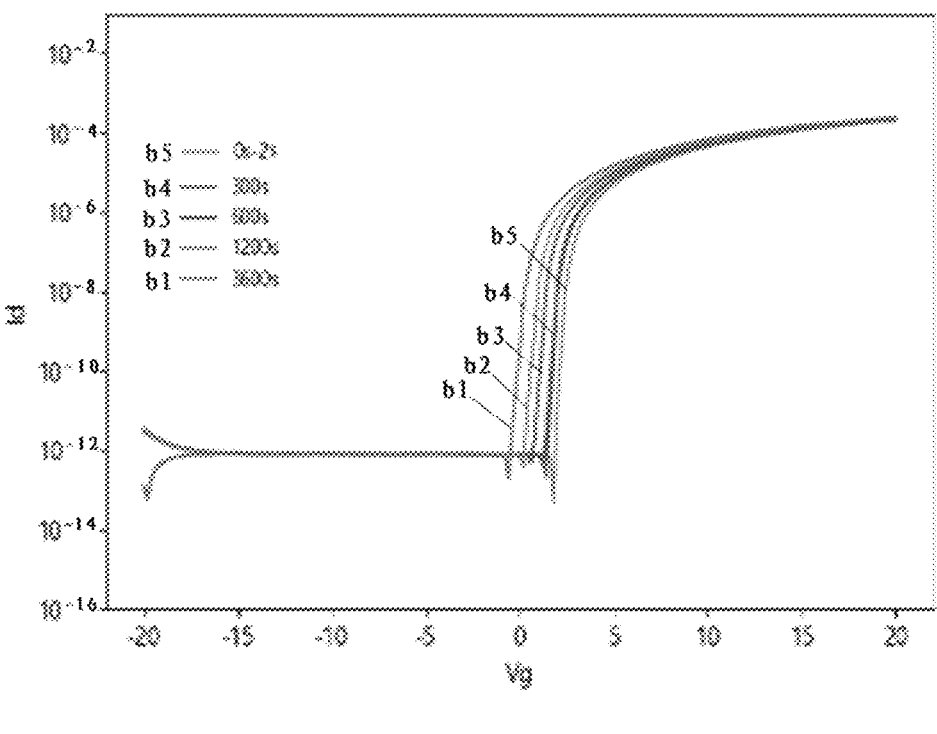
FIG. 4 is a light stability test curve of the semiconductor material thin film of InTaSnPrO$_y$ in the embodiment 1.

The test conditions for NBTIS (Negative bias temperature illumination stability) are as follows: white light 6000 nits irradiation, Vgs=−30V, Time=3600 s. FIG. 4 is the light stability test curve, and as shown in FIG. 4, the threshold voltage offset of light stability $\Delta V_{th}$=−1.7V, and the stability is good.

Embodiment 2

Figure 2:
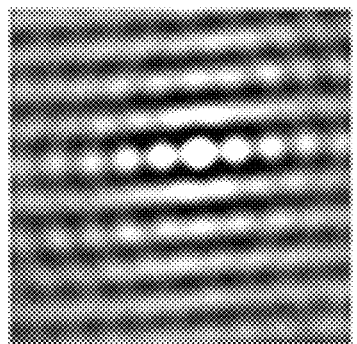
FIG. 2 is an enlarged schematic view of a partial A in FIG. 1.
Figure 3:
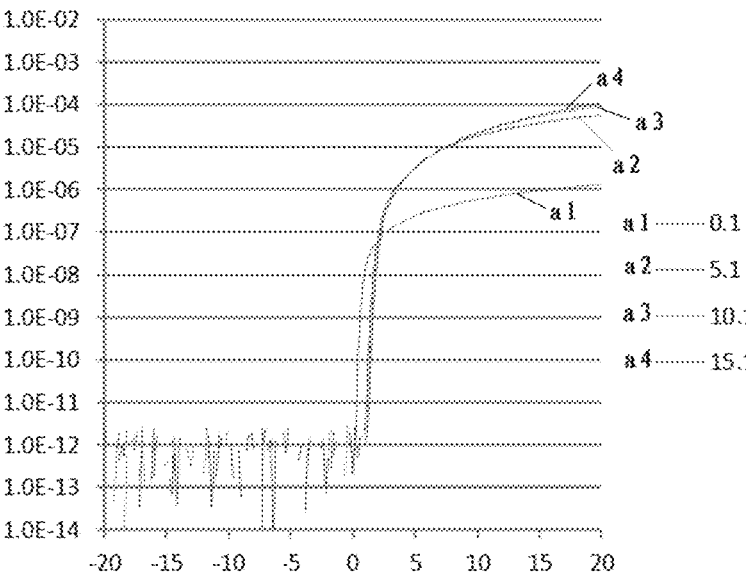
FIG. 3 is a TFT characteristic curve of the semiconductor material thin film of InTaSnPrO$_y$ in the embodiment 1.

The semiconductor material thin film according to the embodiment of the present disclosure may be doped with a small amount of Ta oxide in the indium oxide semiconductor thin film by ceramic target magnetron sputtering to improve the ability of anti-H and oxygen fixation, with a small amount of Sn oxide to improve the acid corrosion resistance, with a small amount of Al oxide to form a microcrystalline structure (as shown in FIG. 1 and FIG. 2), and with $TbB_6$ to improve light stability. The semiconductor material $TbB_x$:$InTaSnAlO_y$ is formed in such a way, in which y is greater than zero, and based on the total mass of oxides of four elements In, Ta, Sn, Al, and boride of Tb ($TbB_6$), the mass ratio of oxides of In is 83%, the mass ratio of oxides of Ta is 3%, the mass ratio of oxides of Sn is 8%, the mass ratio of oxides of Al is 3%, and the mass ratio of boride of Tb is 3%. The thickness of the $TbB_x$:$InTaSnAlO_y$ semiconductor material thin film is 30 nm, and the carrier concentration is less than $5\times10^{19}$ cm$^{-3}$. The threshold voltage for the TFT characteristics is 0.6V and the mobility is 65 cm$^2$/Vs. The test conditions for NBTIS (Negative bias temperature illumination stability) are as follows: white light 6000 nits irradiation, Vgs=−30V, Time=3600 s). The threshold voltage offset $\Delta V$th, which reflects the light stability, is equal to −0.8V.

Embodiment 3

The semiconductor material is $InTaSnPrO_y$ material, in which y is greater than zero, and the $InTaSnPrO_y$ represents oxides of four elements In, Ta, Sn and Pr. That is, the semiconductor material comprises: an oxide of a first element, an oxide of a second element, an oxide of a third element and a compound of a fifth element, and the first element is In, the second element is Ta, the third element is Sn and the compound of the fifth element is oxide of Pr.

The mass ratio of In oxides, Ta oxides, Sn oxides and Pr oxides is: 90%:1.2%:8%:0.8%, the thickness of the semiconductor material thin film is 30 nm, and the carrier concentration is less than $5\times10^{19}$ cm$^{-3}$; the threshold voltage of TFT characteristic is −1.2V, the mobility is 76 cm$^2$/Vs, the threshold voltage offset $\Delta V_{th}$, which reflects light stability, is equal to −3.5V.

Embodiment 4

The semiconductor material is $InTaZnPrO_y$ material, in which y is greater than zero, and the $InTaZnPrO_y$ represents oxides of four elements In, Ta, Zn and Pr. That is, the semiconductor material may comprise: an oxide of a first element, an oxide of a second element, an oxide of a fourth element and a compounds of a fifth element, and the first element is In, the second element is Ta, the fourth element is Zn and the compounds of the fifth element are oxide of Pr. The mass ratios of In oxides, Ta oxides, Zn oxides and Pr oxides are 90%, 2%, 6.5%, 1.5% respectively.

Figure 6:
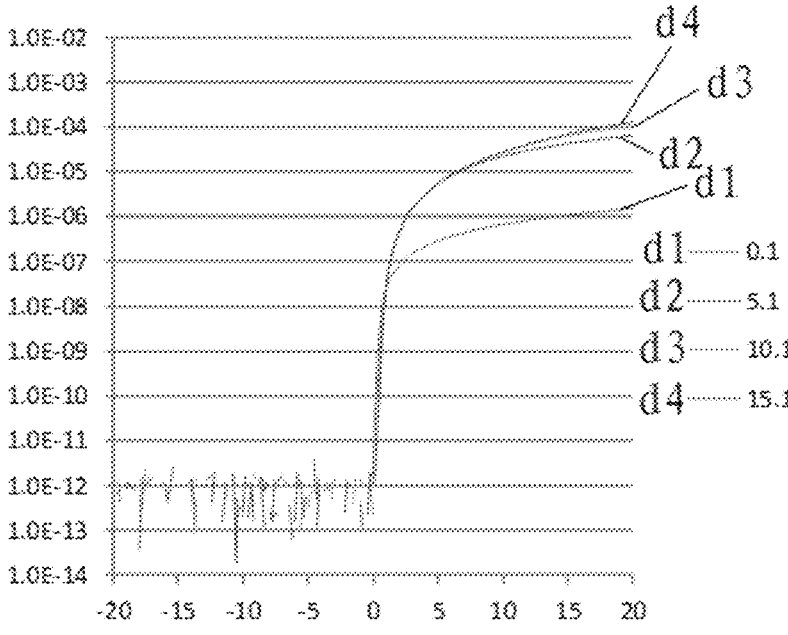
FIG. 6 is a TFT characteristic curve of the semiconductor material thin film of InTaZnPrO$_y$ in the embodiment 4.

The thickness of the semiconductor material thin film is 30 nm, and the carrier concentration is less than $5\times10^{19}$ cm$^{-3}$; the TFT characteristics may be shown in FIG. 6 and Table 2, and the mobility is 49 cm$^2$/Vs.

TABLE 2

| | | Test data of the TFT characteristics | | | |
|---|---|---|---|---|---|
| $V_{ds}$ (drain voltage, V) | $I_{on}$ (on-state current, A) | $I_{off}$ (off-state current, A) | $I_{on/off}$ (on/off ratio) | SS(Sub-threshold swing, V/Dev.) | $V_{th}$ (V) |
| 0.1 | 1.1E−06 | 2.3E−12 | 4.8E+05 | 0.141 | 0.358 |
| 5.1 | 4.5E−05 | 2.1E−13 | 2.2E+08 | 0.141 | 0.535 |
| 10.1 | 6.8E−05 | 9.5E−14 | 7.2E+08 | 0.185 | 0.591 |
| 15.1 | 7.7E−05 | 1.2E−13 | 6.6E+08 | 0.174 | 0.609 |

Figure 7:
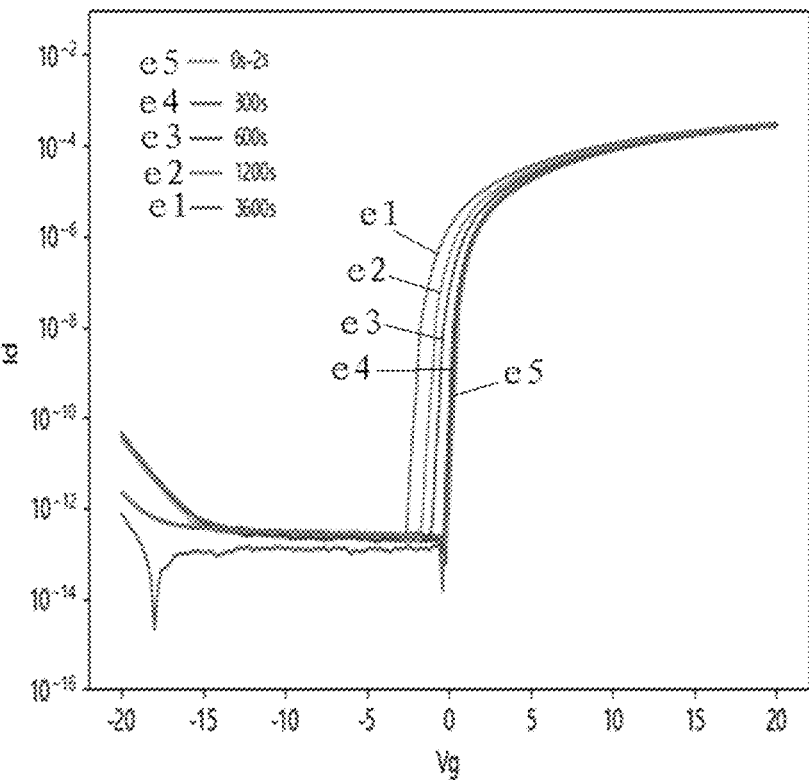
FIG. 7 is a light stability test curve of the semiconductor material thin film of InTaSnPrO$_y$ in the embodiment 4.

The test conditions for NBTIS (Negative bias temperature illumination stability) are as follows: white light 6000 nits irradiation, Vgs=−30V, Time=3600 s). FIG. 7 is the light stability test curve, and as shown in FIG. 7, the threshold voltage offset $\Delta V$th of light stability is equal to −2.5V, and the stability is good.

Embodiment 5

The semiconductor material is $InWSnTbOB_y$ material, in which y is greater than zero, and the $InWSnTbOB_y$ represents oxides of three elements In, Ta, and Sn as we as borides of Tb. That is, the semiconductor material comprise: an oxide of a first element, an oxide of a second element, an oxide of a third element and a compound of a fifth element, and the first element is In, the second element is W, the third element is Sn and the compound of the fifth element is boride of Tb. The mass ratio of In oxide, W oxide, Sn oxide and Tb boride is: 90%:2%:6%:2%, the thickness of the semiconductor material thin film is 30 nm, and the carrier concentration is less than $5\times10^{19}$ cm$^{-3}$; the threshold voltage of TFT characteristic is 0.6V, the mobility is 48 cm$^2$/Vs, the threshold voltage offset $\Delta V_{th}$, which reflects light stability, is equal to −1.3V.

Embodiment 6

The semiconductor material is InTaZnTbO material, and the InTaZnTbO represents oxide of In, Ta and Zn as well as boride of Tb. That is, the semiconductor material comprise: an oxide of a first element, an oxide of a second element, an oxide of a third element and a compound of a fifth element, and the first element is In, the second element is Ta, the four element is Zn and the compound of the fifth element is oxide of Tb. The mass ratio of In oxide, Ta oxide, Zn oxide and Tb oxide is: 85%:2%:8%:5%, the thickness of the semiconductor material thin film is 50 nm, and the carrier concentration is less than 5×10$^{19}$ cm$^{-3}$; the threshold voltage of TFT characteristic is 1.1V, the mobility is 35 cm$^2$/Vs, the threshold voltage offset ΔVth, which reflects light stability, is equal to −0.2V.

Embodiment 7

The semiconductor material is InTaZnSnPrO material, and the InTaZnSnPrO represents oxides of the five elements In, Ta, Zn, Sn and Pr. That is, the semiconductor material comprises: an oxide of a first element, an oxide of a second element, an oxide of a third element, an oxide of a fourth element and a compound of a fifth element, and the first element is In, the second element is Ta, the third element is Sn, the fourth element is Zn and the compound of the fifth element is oxide of Pr. The mass ratio of In oxide, Ta oxide, Sn oxide, Zn oxide and Pr oxide is: 81%:2%:6.5%:9%:1.5%, the thickness of the semiconductor material thin film is 30 nm, and the carrier concentration is less than 5×10$^{19}$ cm$^{-3}$; the threshold voltage of TFT characteristic is 0.4V, the mobility is 41 cm$^2$/Vs, the threshold voltage offset ΔVth, which reflects light stability, is equal to −1.8V.

The semiconductor material thin film in the above embodiments has high mobility and good stability.

The embodiments of the present disclosure provide a display panel, comprising the light-emitting device described in the above-mentioned embodiments. The display panel having the light-emitting device in the above-mentioned embodiments has better display effect and good stability.

The embodiments of the present disclosure provide a display device, comprising the display panel described in the above-mentioned embodiments. The display device having the display panel in the above embodiments has better display effect and good stability.

The above descriptions are only preferred embodiments of the present disclosure. It should be pointed out that for those skilled in the art, some improvements and modifications can be made without departing from the principles of the present disclosure. These improvements and modifications should also be considered within the protection scope of the present disclosure.

What is claimed is:

1. A semiconductor material, comprises at least two selected from a group consisting of an oxide of a first element, an oxide of a second element, an oxide of a third element, an oxide of a fourth element and a compound of a fifth element, and comprises at least the oxide of the first element and the compound of the fifth element;

the first element comprises at least one selected from a group consisting of In, Zn, Sn, Cd, Tl and Pb;

the second element comprises at least one selected from a group consisting of Ta, Ga, W, Ba, V, Hf and Nb;

the third element comprises at least one selected from a group consisting of Sn, Zr, Cr and Si;

the fourth element comprises at least one selected from a group consisting of Zn, Al, Sn, Ta, Hf, Zr and Ti; and the compound of the fifth element comprises M$_x$A, wherein M comprises at least one selected from a group consisting of Ce, Pr, Nd, Pm, Sm, Tb and Dy; A comprises at least one selected from a group consisting of O, N, S, Se, Te, Br, I, As and B; and x is greater than zero, wherein the mass ratio of the oxide of the first element, the oxide of the second element, the oxide of the third element, the oxide of the fourth element and the compound of the fifth element is (55% to 90%):(0% to 10%):(0% to 10%):(0% to 10%):(0.0001% to 15%).

2. The semiconductor material according to claim 1, wherein, the first element comprises at least one selected from a group consisting of In, Zn and Sn; and/or the second element comprises at least one selected from a group consisting of Ta, Ga and W; and/or the third element comprises Sn; and/or the fourth element comprises at least one selected from a group consisting of Zn, Al and Ta; and/or M comprises at least one selected from a group consisting of Pr, Sm and Tb, and A comprises at least one selected from a group consisting of O, N and B.

3. The semiconductor material according to claim 1, wherein, the semiconductor material comprises: the oxide of the first element, the oxide of the second element, the oxide of the third element and the compound of the fifth element, wherein the first element is In, the second element is Ta, the third element is Sn and the compound of the fifth element is an oxide of Pr; or the semiconductor material comprises: the oxide of the first element, the oxide of the second element, the oxide of the fourth element and the compound of the fifth element, wherein the first element is In, the second element is Ta, the fourth element is Zn and the compound of the fifth element is an oxide of Pr; or the semiconductor material comprises: the oxide of the first element, the oxide of the second element, the oxide of the third element, the oxide of the fourth element and the compound of the fifth element, wherein the first element is In, the second element is Ta, the third element is Sn, the fourth element is Al and the compound of the fifth element is a boride of Tb; or the semiconductor material comprises: the oxide of the first element, the oxide of the second element, the oxide of the fourth element and the compound of the fifth element, wherein the first element is In and Zn, the second element is Ta, the fourth element is Al and the compound of the fifth element is a boride of Tb; or the semiconductor material comprises: the oxide of the first element, the oxide of the second element, the oxide of the third element and the compound of the fifth element, wherein the first element is In, the second element is W, the third element is Sn and the compound of the fifth element is a boride of Tb; or the semiconductor material comprises: the oxide of the first element, the oxide of the second element, the oxide of the third element and the compound of the fifth element, wherein the first element is In, the second element is Ta, the fourth element is Zn and the compound of the fifth element is an oxide of Tb; or the semiconductor material comprises: the oxide of the first element, the oxide of the second element, the oxide of the third element, the oxide of the fourth element and the compound of fifth element, wherein the first element is In, the second element is Ta, the third element is Sn, the fourth element is Zn and the compound of the fifth element is an oxide of Pr; or the semiconductor material comprises: the oxide of the first element, the oxide of the second element, the oxide of the third element, the oxide of the fourth element and the compound of fifth element, wherein the first element is In, the second element is Ta, the third element is Sn, the fourth element is Zn and the compound of the fifth element is a boride of Tb.

4. A light-emitting device, comprises a semiconductor thin film which comprises the semiconductor material according to claim 1.

5. The light-emitting device according to claim 4, wherein a carrier concentration of the semiconductor thin film is less than or equal to $5\times10^{19}$ cm$^{-3}$.

6. The light-emitting device according to claim 4, wherein a mobility of the semiconductor thin film is in a range of 30 cm$^2$/Vs to 200 cm$^2$/Vs.

7. The light-emitting device according to claim 4, wherein a thickness of the semiconductor thin film is in a range of 20 nm to 100 nm.

8. The light-emitting device according to claim 4, wherein the semiconductor thin film has microcrystalline structure.

9. The light-emitting device according to claim 4, wherein the light-emitting device further comprising:

a substrate on which a gate layer locates; and a gate insulating layer which covers the gate layer, wherein the semiconductor thin film is provided on the gate insulating layer and has a source and a drain.

10. A display panel, comprises the light-emitting device according to claim 4.

11. A display device, comprises the display panel according to claim 10.

12. The display panel according to claim 10, wherein a carrier concentration of the semiconductor thin film is less than or equal to $5\times10^{19}$ cm$^{-3}$.

13. The display panel according to claim 10, wherein a mobility of the semiconductor thin film is in a range of 30 cm$^2$/Vs to 200 cm$^2$/Vs.

14. The display panel according to claim 10, wherein a thickness of the semiconductor thin film is in a range of 20 nm to 100 nm.

15. The display panel according to claim 10, wherein the semiconductor thin film has microcrystalline structure.

16. The display panel according to claim 10, wherein the light-emitting device further comprising:

a substrate on which a gate layer locates; and a gate insulating layer which covers the gate layer, wherein the semiconductor thin film is provided on the gate insulating layer and has a source and a drain.

17. The light-emitting device according to claim 4, wherein, the first element comprises at least one selected from a group consisting of In, Zn and Sn; and/or the second element comprises at least one selected from a group consisting of Ta, Ga and W; and/or the third element comprises Sn; and/or the fourth element comprises at least one selected from a group consisting of Zn, Al and Ta; and/or

12

M comprises at least one selected from a group consisting of Pr, Sm and Tb, and A comprises at least one selected from a group consisting of O, N and B.

18. The light-emitting device according to claim 4, wherein, the semiconductor material comprises: the oxide of the first element, the oxide of the second element, the oxide of the third element and the compound of the fifth element, wherein the first element is In, the second element is Ta, the third element is Sn and the compound of the fifth element is an oxide of Pr; or the semiconductor material comprises: the oxide of the first element, the oxide of the second element, the oxide of the fourth element and the compound of the fifth element, wherein the first element is In, the second element is Ta, the fourth element is Zn and the compound of the fifth element is an oxide of Pr; or the semiconductor material comprises: the oxide of the first element, the oxide of the second element, the oxide of the third element, the oxide of the fourth element and the compound of the fifth element, wherein the first element is In, the second element is Ta, the third element is Sn, the fourth element is Al and the compound of the fifth element is a boride of Tb; or the semiconductor material comprises: the oxide of the first element, the oxide of the second element, the oxide of the fourth element and the compound of the fifth element, wherein the first element is In and Zn, the second element is Ta, the fourth element is Al and the compound of the fifth element is a boride of Tb; or the semiconductor material comprises: the oxide of the first element, the oxide of the second element, the oxide of the third element and the compound of the fifth element, wherein the first element is In, the second element is W, the third element is Sn and the compound of the fifth element is a boride of Tb; or the semiconductor material comprises: the oxide of the first element, the oxide of the second element, the oxide of the third element and the compound of the fifth element, wherein the first element is In, the second element is Ta, the fourth element is Zn and the compound of the fifth element is an oxide of Tb; or the semiconductor material comprises: the oxide of the first element, the oxide of the second element, the oxide of the third element, the oxide of the fourth element and the compound of fifth element, wherein the first element is In, the second element is Ta, the third element is Sn, the fourth element is Zn and the compound of the fifth element is an oxide of Pr; or the semiconductor material comprises: the oxide of the first element, the oxide of the second element, the oxide of the third element, the oxide of the fourth element and the compound of fifth element, wherein the first element is In, the second element is Ta, the third element is Sn, the fourth element is Zn and the compound of the fifth element is a boride of Tb.

\* \* \* \* \*